(12) United States Patent
Wei et al.

(10) Patent No.: US 11,163,018 B1
(45) Date of Patent: Nov. 2, 2021

(54) DEVICE AND METHOD FOR DETECTING MISCONNECTION OF ELECTRIC METERS

(71) Applicant: STATE GRID HUBEI ELECTRIC POWER CO., LTD. MEASUREMENT CENTER, Hubei (CN)

(72) Inventors: Wei Wei, Hubei (CN); Li Ding, Hubei (CN); Fan Li, Hubei (CN); Dengping Tang, Hubei (CN); Xuxiang Wang, Hubei (CN); He Yu, Hubei (CN); Jun Li, Hubei (CN); Shuibin Xia, Hubei (CN); Xin Zheng, Hubei (CN); Li Li, Hubei (CN); Lihua Yang, Hubei (CN); Juan Qiu, Hubei (CN)

(73) Assignee: STATE GRID HUBEI ELECTRIC POWER CO., LTD. MEASUREMENT CENTER, Hubei (CN)

( * ) Notice: Subject to any disclaimer, the term of this patent is extended or adjusted under 35 U.S.C. 154(b) by 0 days.

(21) Appl. No.: 16/498,978

(22) PCT Filed: Jul. 31, 2019

(86) PCT No.: PCT/CN2019/098654
§ 371 (c)(1),
(2) Date: Sep. 27, 2019

(87) PCT Pub. No.: WO2020/119141
PCT Pub. Date: Jun. 18, 2020

(30) Foreign Application Priority Data

Dec. 14, 2018 (CN) .......................... 201811535396.4

(51) Int. Cl.
*G01R 31/67* (2020.01)
*G08C 19/02* (2006.01)
(Continued)

(52) U.S. Cl.
CPC ............. *G01R 31/67* (2020.01); *G01R 31/54* (2020.01); *G08C 19/02* (2013.01); *G08C 25/02* (2013.01)

(58) Field of Classification Search
CPC ...... G01R 31/67; G01R 31/54; G01R 22/063; G01R 22/061; G08C 19/02; G08C 25/02;
(Continued)

(56) References Cited

U.S. PATENT DOCUMENTS

| 2010/0007219 A1* | 1/2010 | de Buda | ................ | H04B 3/546 |
| | | | | 307/149 |
| 2014/0358839 A1* | 12/2014 | Dhurandhar | ............. | G01D 4/00 |
| | | | | 706/48 |

FOREIGN PATENT DOCUMENTS

| CN | 105223537 A | * | 1/2016 |
| CN | 105823915 A | * | 8/2016 |

(Continued)

OTHER PUBLICATIONS

A. Pasdar and S. Mirzakuchaki, "A Solution to Remote Detecting of Illegal Electricity Usage Based on Smart Metering," 2007 2nd International Workshop on Soft Computing Applications, 2007, pp. 163-167 (Year: 2007).*

(Continued)

*Primary Examiner* — Daniel R Miller
(74) *Attorney, Agent, or Firm* — Burns & Levinson, LLP; Joseph M. Maraia

(57) ABSTRACT

Disclosed are a non-to-the-home type device and method for detecting electric meter misconnection based on the PLC communication technology and using multiple frequencies. The detection device includes a master detection device and a slave detection device. The master detection device acquires address information of different electric meters at the outlet terminals of the electric meters by using RS485 communication. The modulation circuit modulates the com- (Continued)

munication address information of different electric meters into high-frequency carrier signals of different frequencies, and sends the high-frequency carrier signals to user sides by using the PLC communication technology. A line trap is provided between the modulation circuit and the electric meters. The slave detection device has a high-frequency carrier signal detection antenna. The user side detects the high-frequency carrier signal, demodulates the high-frequency carrier signal to obtain the high-frequency carrier signal frequency and the communication address information of the electric meter corresponding to user.

7 Claims, 1 Drawing Sheet

(51) Int. Cl.
  *G01R 31/54* (2020.01)
  *G08C 25/02* (2006.01)
(58) Field of Classification Search
  CPC ........ G08C 17/02; H04L 67/12; G01D 4/002; G01D 4/004; G01D 2204/45; G01D 2204/18; G01D 4/008; G01D 2204/47; G01D 4/006; G01D 2204/22; G01D 2204/40–47
  See application file for complete search history.

(56) References Cited

FOREIGN PATENT DOCUMENTS

| | | | |
|---|---|---|---|
| CN | 107907788 A | * | 4/2018 |
| CN | 107957531 A | | 4/2018 |
| CN | 107966631 A | | 4/2018 |
| CN | 108279343 A | * | 7/2018 |
| CN | 207601175 U | | 7/2018 |
| CN | 208140852 U | | 11/2018 |
| CN | 109375046 A | | 2/2019 |
| WO | 20170186242 A1 | | 11/2017 |

OTHER PUBLICATIONS

M. U. Hashmi and J. G. Priolkar, "Anti-theft energy metering for smart electrical distribution system," 2015 International Conference on Industrial Instrumentation and Control (ICIC), 2015, pp. 1424-1428 (Year: 2015).*

D. Xiong, Y. Chen, X. Chen and J. Yang, "Design of the intelligent detection instrument used in user electricity lines missort fault," 2017 4th International Conference on Systems and Informatics (ICSAI), 2017, pp. 329-334 (Year: 2017).*

Shou, J. et al. Design of Detection System of Multi-User Missort Fault Energy Meters Based on Different Frequency Signals. Power System Technology, vol. 39, No. 2 (Apr. 30, 2018), pp. 162-165 [English abstract only].

Zhou, T. et al. The Study and Design of Non-Household Missort Fault Positioning System on the Basis of Power Line Carrier Communication Technology. Electric Power Column, No. 8 (Aug. 31, 2017), pp. 125-127 [English abstract only].

International Search Report for PCT/CN2019/098654 dated Oct. 25, 2019.

Office Action for Chinese Patent Application No. 201811535396.4 dated Oct. 24, 2019.

* cited by examiner

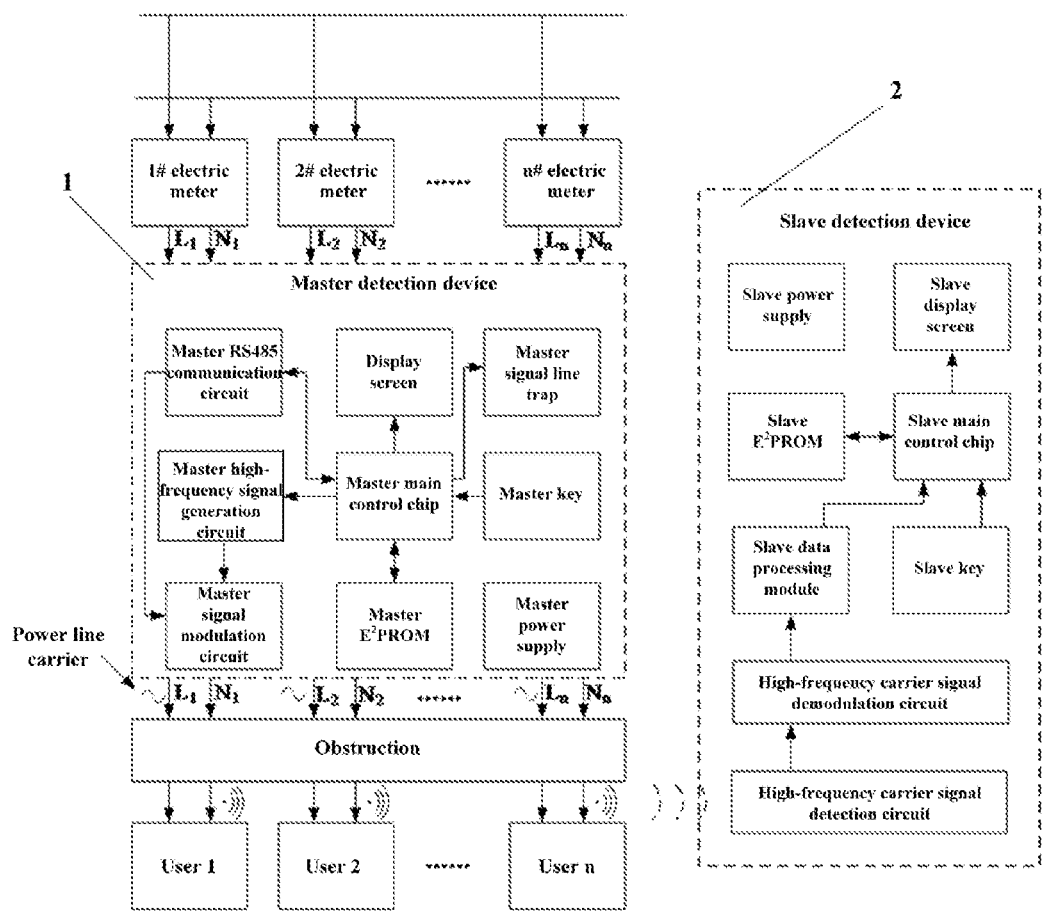

DEVICE AND METHOD FOR DETECTING MISCONNECTION OF ELECTRIC METERS

CROSS REFERENCE TO RELATED APPLICATIONS

This application is a United States national phase application under 35 U.S.C. 371 of co-pending International Patent Application Number PCT/CN2019/098654, filed on Jul. 31, 2019, which claims priority to Chinese Patent Application No. 201811535396.4, filed on Dec. 14, 2018, disclosures of which are incorporated herein by reference in their entireties for all purposes.

TECHNICAL FIELD

The present disclosure relates to the field of detection technologies for misconnection of electric meters, for example, a device and method for detecting electric meter misconnection.

BACKGROUND

With the continuous expansion of urban sizes, newly-built residential buildings are increasing. For most buildings, the electric meters are installed in a centralized manner. A certain distance exists between the installation site of the electric meters and the drop cables and the electric meters are covered by obstructions. Therefore, it is difficult for the onsite cable connection personnel to ensure completely correct connection correspondence between electric meters and users. As a result, misconnection of electric meters occurs.

To avoid misconnection of electric meters and to ensure normal power usage of users, three methods are mainly adopted for detecting misconnection of electric meters at present. The first method is to detect misconnection of electric meters in the manner of interrupting the electric energy and increasing user power usage. The first method can effectively facilitate detection of electric meter misconnection but affects the normal power usage of users. The second method is to detect misconnection of electric meters in the manner of installing both the detection device at the outlet terminal of the electric meter and the household detection device. Misconnection is determined by testing the connection condition between the detection devices installed at the outlet terminal of the electric meter and the detection devices installed at the households. The second method needs user cooperation and the personnel needs enter user's home, seriously affecting the daily life of users. In the third method, a signal is transmitted from an outlet terminal of a certain electric meter, the signal is detected at different user sides by using the detection device, and the user side the received signal of which has the strongest intensity is considered to correspond to the electric meter. The third method only allows one electric meter be detected each time, so the detection efficiency is low.

SUMMARY

The following is a summary of the subject matter described herein in detail. This summary is not intended to limit the scope of the claims.

The present disclosure provides a non-to-the-home type device and method for detecting misconnection of electric meters based on the Power Line Communication (PLC) technology and using multiple frequencies. Without affecting normal power usage and daily life of users, the correspondence between multiple electric meters and users is detected at once by using the PLC technology, and misconnection of electric meters is investigated, so that the detection efficiency is improved.

The present disclosure provides a device for detecting electric meter misconnection. The device includes a master detection device and a slave detection device. The master detection device is connected to electric meters in an electric well. The master detection device includes a master RS485 communication circuit, a master high-frequency signal generation circuit, a master signal modulation circuit, a master key, a master main control chip, a master $E^2PROM$ and a master signal line trap. The slave detection device includes a high-frequency carrier signal detection circuit, a high-frequency carrier signal demodulation circuit, a slave data processing module, a slave main control chip and a slave $E^2PROM$, which are connected in sequence.

An input terminal of the master RS485 communication circuit is connected to the electric meters. An output terminal of the master RS485 communication circuit is connected to the master main control chip. The master RS485 communication circuit is configured to acquire communication address information of each electric meter.

An input terminal of the master high-frequency signal generation circuit is connected to the master main control chip. High-frequency signals having different frequencies generated by the master high-frequency signal generation circuit are outputted through an output terminal of the master high-frequency signal generation circuit outputs.

The master signal modulation circuit is configured to: encode the communication address information of each electric meter acquired by the master RS485 communication circuit to generate a self-defined protocol and encoded information; acquire the high-frequency signals of different frequencies generated by the master high-frequency signal generation circuit; and modulate the self-defined protocol into the high-frequency signals to generate high-frequency carrier signals. Then, the master signal modulation circuit feeds the high-frequency carrier signals into the outlet terminals of the electric meters.

The high-frequency carrier signals include a first high-frequency carrier signal transmitted to a power grid and a second high-frequency carrier signal transmitted to a user air switch. The master key is connected to the master main control chip. The master key is configured to input a preset high-frequency carrier signal frequency.

The master $E^2PROM$ is connected to the master main control chip and is configured to store the acquired communication address information of the electric meters and preset high-frequency carrier signal frequency. The master signal line trap is connected to the electric meters and is configured to absorb the first high-frequency carrier signal and a high-frequency interference signal transmitted from the power grid to the outlet terminal of the electric meters.

The high-frequency carrier signal detection circuit is provided with a detection antenna, and is arranged at a position close to the user air switch and configured to detect the second high-frequency carrier signal. The detected second high-frequency carrier signal is amplified to acquire a third high-frequency carrier signal. The third high-frequency carrier signal is transmitted to the high-frequency carrier signal demodulation circuit. The high-frequency carrier signal demodulation circuit is configured to demodulate the third high-frequency carrier signal to acquire a target high-frequency carrier signal frequency, and acquire the encoded information and the preset high-frequency carrier signal frequency transmitted by the master detection device.

The slave data processing module is connected to the slave main control chip and is configured to perform protocol analysis, according to the self-defined protocol, on the encoded information and the detected second high-frequency carrier signal to acquire the address information of the electric meter corresponding to user.

The slave E$^2$PROM is connected to the slave main control chip and is configured to store the preset high-frequency carrier signal frequency, the target high-frequency carrier signal frequency and the communication address information of the electric meter acquire by the analysis of the slave data processing module.

The master detection device further includes a master display screen and a master power supply which are respectively connected to the master main control chip. The slave detection device further includes a slave display screen, a slave key and a slave power supply which are respectively connected to the slave main control chip.

The master display screen is configured to display address information of the electric meters acquired by the master RS485 communication circuit and the preset high-frequency signal frequency inputted by the master key.

The master power supply is configured to supply power to the master detection device. The master power supply is a lithium battery or the master power supply acquires electricity from an inlet terminal of the electric meter through the electromagnetic coil.

The master main control chip and the slave main control chip are Field Programmable Gate Array (FPGA), Digital Signal Processing (DSP), ARM or single chip microcomputer.

The present disclosure provides a method for detecting misconnection of electric meters. The method is applied to the device for detecting electric meter misconnection. The method includes the followings steps. Communication address information of the electric meters are acquired through the master RS485 communication circuit by the master detection device. The master high-frequency signal generation circuit in the master detection device generates high-frequency signals with different frequencies.

The master signal modulation circuit in the master detection device encodes communication address information of the electric meters to generate a self-defined protocol and encoded information; acquires the high-frequency signals with different frequencies generated by the master high-frequency signal generation circuit; modulates the self-defined protocol into the high-frequency signals to generate high-frequency carrier signals; and feeds the high-frequency carrier signals into the outlet terminals of the electric meters. The high-frequency carrier signal includes a first high-frequency carrier signal to be transmitted to a power grid and a second high-frequency carrier signal to be transmitted to a user air switch. A preset high-frequency carrier signal frequency is input by the master key in the master detection device. The master signal modulation circuit in the master detection device transmits the second high-frequency carrier signal to the user air switch through the PLC communication technology. The master signal line trap in the master detection device is connected to outlet terminals of the electric meters and absorbs the first high-frequency carrier signal and a high-frequency interference signal transmitted from the power grid to the outlet terminals of the electric meters. The high-frequency carrier signal detection circuit in the slave detection device detects the second high-frequency carrier signal, amplifies the detected second high-frequency carrier signal to acquire a third high-frequency carrier signal, and transmits the third high-frequency carrier signal to the high-frequency carrier signal demodulation circuit. The high-frequency carrier signal demodulation circuit in the slave detection device demodulates the third high-frequency carrier signal to acquire a target high-frequency carrier signal frequency, and acquires the preset high-frequency carrier signal frequency and the encoded information transmitted by the master detection device. The slave data processing module in the slave detection device performs protocol analysis, according to the self-defined protocol, on the encoded information and the detected second high-frequency carrier signal to acquire the address information of electric the energy meter corresponding to user. The preset high-frequency carrier signal frequency, the target high-frequency carrier signal frequency and the address information of the electric meter obtained through the protocol analysis by the slave data processing module are stored in the slave E2PROM in the slave detection device. The preset high-frequency carrier signal frequency is matched with the target high-frequency carrier frequency to determine whether the electric meter misconnection occurs.

Other aspects can be understood after the drawings and the detailed description are read and understood.

BRIEF DESCRIPTION OF DRAWINGS

FIG. 1 is a schematic diagram illustrating the structure and the principle of the present disclosure.

DETAILED DESCRIPTION

The technical solutions in the embodiment of the present disclosure will be described clearly and completely in connection with the drawing in the embodiment of the present disclosure. The embodiments described below are part, not all, of the embodiments of the present disclosure.

As shown in FIG. 1, a device for detecting misconnection of electric meters based on the PLC communication technology and using multiple frequencies includes a master detection device 1 and a slave detection device 2. The master detection device 1 is connected to electric meters in an electric well. The master detection device 1 includes a master RS485 communication circuit, a master high-frequency signal generation circuit, a master signal modulation circuit, a master key, a master main control chip, a master E$^2$PROM and a master signal line trap. The slave detection device 2 includes a high-frequency carrier signal detection circuit, a high-frequency carrier signal demodulation circuit, a slave data processing module, a slave main control chip and a slave E$^2$PROM connected in sequence.

An input terminal of the master RS485 communication circuit is connected to the electric meters in the electric well (FIG. 1 does not directly show the connection between the master RS485 communication circuit and the electric meters, but shows that the electric meters are connected to the master detection device 1 so as to show the connection between the master RS485 communication circuit and the electric meters). The output terminal of the master RS485 communication circuit is connected to the master main control chip. The master RS485 communication circuit is configured to read communication address information of the multiple electric meters.

An input terminal of the master high-frequency signal generation circuit is connected to the master main control chip. High-frequency signals of different frequencies generated by the master high-frequency signal generation circuit are outputted through an output terminal of the master high-frequency signal generation circuit.

The master signal modulation circuit in the master detection device encodes communication address information of the electric meters to generate a self-defined protocol and encoded information; acquires the high-frequency signals of different frequencies generated by the master high-frequency signal generation circuit; modulates the self-defined protocol into the high-frequency signals to generate high-frequency carrier signals; and feeds the high-frequency carrier signals into the outlet terminals of the electric meters. The high-frequency carrier signal includes a first high-frequency carrier signal to be transmitted to a power grid and a second high-frequency carrier signal to be transmitted to a user air switch.

The master key is connected to the master main control chip and is configured to input a preset high-frequency carrier signal frequency.

The $E^2PROM$ of the master detection device is connected to the master main control chip. The master $E^2PROM$ is a storage unit of the master detection device and is configured to store the acquired communication address information of the electric meters and information of the preset high-frequency carrier signal frequency.

The master signal line trap is connected to the electric meters in the electric well (the connection between the master signal line trap and the electric meters is not directly shown in FIG. 1, however, FIG. 1 shows the connection between the electric meters and the master detection device 1, which is used for representing the connection between the master signal line trap and the electric meters). The master signal line trap is configured to absorb the first high-frequency carrier signal and the high-frequency interference signal transmitted from a large power grid to the outlet terminals of the electric meters.

The high-frequency carrier signal detection circuit is provided with a detection antenna and is arranged close to the user air switch. The high-frequency carrier signal detection circuit is configured to: detect the second high-frequency carrier signal, amplify the detected second high-frequency carrier signal to obtain a third high-frequency carrier signal, and transmit the third high-frequency carrier signal to the high-frequency carrier signal demodulation circuit.

The high-frequency carrier signal demodulation circuit is configured to: demodulate the third high-frequency carrier signal to obtain a target high-frequency carrier signal frequency, and obtain the encoded information and the preset high-frequency carrier signal frequency transmitted by the master detection device. The slave data processing module is connected to the slave main control chip, and is configured to perform protocol analysis, according to the self-defined protocol, on the encoded information and the detected second high-frequency carrier signal to acquire the address information of the electric meter corresponding to the user.

The slave $E^2PROM$ is connected to the slave main control chip. The slave $E^2PROM$ is a storage unit of the slave detection device and is configured to store the preset high-frequency carrier signal frequency, the target high-frequency signal frequency and the address information of the electric meter obtained through the analysis by the slave data processing module.

The master main control chip is configured to control related internal circuits of the master device to normally operate according to settings, and the slave main control chip is configured to control related internal circuits of the slave device to normally operate according to settings.

The master detection device 1 further includes a master display screen and a master power supply which are respectively connected to the master main control chip. The slave detection device 2 further includes a slave display screen, a slave key and a slave power supply which are respectively connected to the slave main control chip.

The master display screen is configured to display communication address information of the electric meters acquired by the master RS485 communication circuit and multiple preset high-frequency signal frequencies inputted via the master key.

The master key is also configured to query the communication address information of the electric meters acquired by the master RS485 communication circuit and the multiple preset high-frequency carrier signal frequencies inputted by the master key.

The master power supply is configured to supply power to the master detection device. The master power supply is a lithium battery or the master power supply acquiring electricity from an inlet terminal of the electric meter through the electromagnetic coil.

The present disclosure provides a non-to-the-home type device and method for detecting misconnection of electric meters based on the PLC communication technology and by using multiple frequencies. The detection device includes a master device and slave devices. The master device obtains, by using RS485 communication, address information of the electric meters at outlet terminals of the electric meters. The modulation circuit modulates the communication address information of the electric meters into high-frequency carrier signals with different frequencies, and sends the high-frequency carrier signals to the user sides by using the PLC communication technology. The line trap is provided between the modulation circuit and the electric meter to prevent the high-frequency carrier signals from transmitting between the adjacent electric meters and influencing the reliability of the detection result. The high-frequency carrier signal at the user air switch will be dispersed to the space due to the change of the transmission impedance. The slave device is provided with a high-frequency carrier signal detection antenna. The high-frequency carrier signal is detected at each user side, the high-frequency carrier signal is demodulated to obtain the high-frequency carrier signal frequency, and the address information of the electric meter corresponding to the user is obtained. Thus, the non-to-the-home detection of the electric meter misconnection is achieved.

With an example in which n electric meters are installed in an electric well in a certain residential building, an exemplary embodiment of detecting the electric meter misconnection is described in the present disclosure.

FIG. 1 is a diagram showing wire connections in a non-to-the-home type device and method for detecting misconnection of electric meters based on the PLC communication technology and using multiple frequencies according to the present disclosure. Not all meters are connected to its corresponding user. The electric meter misconnection needs to be detected by using the scheme of the present disclosure. The method for detecting misconnection of electric meters includes the following steps.

In step one, according to FIG. 1, the outlet terminals of the multiple electric meters in the electric well are connected to the master detection device.

In step two, the master detection device is configured to read communication address information ID1-IDn of all the electric meters through the RS485 communication circuit.

In step three, the master high-frequency signal generation circuit in the detection device is configured to generate multiple high-frequency signals $f_1$-$f_n$ with different frequencies.

In step four, the master signal modulation circuit in the master detection device is configured to: encode the communication address information of the electric meters to obtain a self-defined protocol and encoded information; acquire the high-frequency signals with different frequencies generated by the master high-frequency signal generation circuit; modulate the self-defined protocol into the high-frequency signals $f_1$-$f_n$ to acquire high-frequency carrier signals; and feed the high-frequency carrier signals into the outlet terminals of the electric meters. The high-frequency carrier signals include a first high-frequency carrier signal to be transmitted to a power grid and a second high-frequency carrier signal to be transmitted to a user air switch.

In step five, the preset high-frequency carrier signal frequency is inputted though the master key in the master detection device.

In step six, the master signal modulation circuit in the master detection device transmits the second high-frequency carrier signal to the user side air switch through the PLC communication technology.

In step seven, the master signal line trap in the master detection device is connected to all the outlet terminals of the electric meters, absorbs the first high-frequency carrier signal and a high-frequency interference signal transmitted to the outlet terminals of the electric meters from a power grid, and prevents the high-frequency carrier signals on adjacent electric meters from mutual interfering.

In step eight, an external wall of each of the users 1 to n where the air switch is installed is provided the slave detection device, the detection personnel sets the high-frequency carrier signal detection circuit in the slave detection device to a detection mode. The high-frequency carrier signal detection circuit detects the second high-frequency carrier signal, amplifies the detected second high-frequency carrier signal to obtain a third high-frequency carrier signal, and transmits the third high-frequency carrier signal to the high-frequency carrier signal demodulation circuit.

In step nine, the high-frequency carrier signal demodulation circuit in the slave detection device demodulates the third high-frequency carrier signal to acquire a target high-frequency carrier signal frequency, and acquires the preset high-frequency carrier signal frequency and the encoded information transmitted by the master detection device.

In step ten, the data processing module in the slave detection device performs protocol analysis, according to the self-defined protocol, on the encoded information and the second high-frequency carrier signal to acquire the address information of the electric meter corresponding to the user.

In step eleven, the slave $E^2PROM$ in the slave detection device stores the preset high-frequency carrier signal frequency, the target high-frequency carrier signal frequency and communication address information of the electric meter obtained by the analysis of the slave data processing module.

In step twelve, the slave detection device is at a certain user, the slave main control chip reads the target high-frequency carrier signal frequency and the preset high-frequency carrier signal frequencies to analyze the correspondence between the electric meter and the user. If the target high-frequency carrier signal frequency is consistent with the preset high-frequency carrier frequency configured in the master detection device, the communication address information of the electric meter is acquired through analysis. The analyzed communication address information of the electric meter is compared with the communication address information of the electric meter of the user read by the master detection device. If the analyzed communication address information of the electric meter is consistent with the read communication address information of the electric meter, it is determined that the electric meter corresponds to the user, and misconnection does not occur. The main control chip stores the acquired electric meter misconnection detection result, the target high-frequency carrier signal frequency and the communication address information of the electric meter of the user into the slave $E^2PROM$ of the detection device, and the electric meter misconnection detection is finished.

The above description is merely example embodiments of the present disclosure for the electric meter misconnection detection, which enables those skilled in the art to understand or implement the present disclosure, but the present application is not limited to the electric meter misconnection detection technology field. According to the claims, the non-to-the-home type device and method for detecting misconnection of electric meters based on the PLC communication technology and by using multiple frequencies proposed by the present disclosure can achieve the electric meter misconnection detection, and also can be used for wiring error detection in related fields. Various modifications made to the embodiment herein will be apparent to those skilled in the art, and the methods and principles adopted by the present disclosure can be implemented in other embodiments without departing from the spirit or scope of the present disclosure. Therefore, the present disclosure is not intended to be limited to the embodiment shown herein but is to be accorded the widest scope consistent with the principles and novel features disclosed herein.

What is claimed is:

1. A device for detecting electric meter misconnection, comprising a master detection device and a slave detection device,
    wherein the master detection device is connected to electric meters in an electric well;
    the master detection device comprises: a master RS485 communication circuit, a master high-frequency signal generation circuit, a master signal modulation circuit, a master key, a master main control chip, a master $E^2PROM$ and a master signal line trap;
    the slave detection device comprises: a high-frequency carrier signal detection circuit, a high-frequency carrier signal demodulation circuit, a slave data processing module, a slave main control chip and a slave $E^2PROM$ connected in sequence;
    an input terminal of the master RS485 communication circuit is connected to the electric meters, an output terminal of the master RS485 communication circuit is connected to the master main control chip, and the master RS485 communication circuit is configured to acquire communication address information of the electric meters;
    an input terminal of the master high-frequency signal generation circuit is connected to the master main control chip, and an output terminal of the master high-frequency signal generation circuit outputs high-frequency signals of different frequencies generated by the master high-frequency signal generation circuit;

the master signal modulation circuit is configured to: encode the communication address information of the electric meters acquired by the master RS485 communication circuit to generate a self-defined protocol and encoded information; acquire the high-frequency signals of different frequencies generated by the master high-frequency signal generation circuit; modulate the self-defined protocol into the high-frequency signals to obtain high-frequency carrier signals; and feed the high-frequency carrier signals into outlet terminals of the electric meters, wherein the high-frequency carrier signals comprise a first high-frequency carrier signal transmitted to a power grid and a second high-frequency carrier signal transmitted to a user air switch;

the master key is connected to the master main control chip and is configured to input a preset high-frequency carrier signal frequency;

the master $E^2PROM$ is connected to the master main control chip and is configured to store the communication address information of the electric meters and the preset high-frequency carrier signal frequency;

the master signal line trap is connected to the electric meters and is configured to absorb the first high-frequency carrier signal and a high-frequency interference signal transmitted from the power grid to the outlet terminals of the electric meters;

the high-frequency carrier signal detection circuit is provided with a detection antenna and is configured to: detect the second high-frequency carrier signal adjacent to the user air switch;

amplify the detected second high-frequency carrier signal to obtain a third high-frequency carrier signal; and transmit the third high-frequency carrier signal to the high-frequency carrier signal demodulation circuit;

the high-frequency carrier signal demodulation circuit is configured to demodulate the third high-frequency carrier signal to obtain a target high-frequency carrier signal frequency, and acquire the preset high-frequency carrier signal frequency and the encoded information transmitted by the master detection device;

the slave data processing module is connected to the slave main control chip and is configured to perform a protocol analysis on the encoded information and the second high-frequency carrier signal according to the self-defined protocol to obtain the communication address information of the electric meter corresponding to users; and the slave $E^2PROM$ is connected to the slave main control chip and is configured to store the preset high-frequency carrier signal frequency, the target high-frequency carrier signal frequency, and the communication address information of the electric meter obtained by the slave data processing module.

2. The device of claim 1, wherein the master detection device further comprises a master display screen and a master power supply separately connected to the master main control chip; and the slave detection device further comprises a slave display screen, a slave key and a slave power supply separately connected to the slave main control chip.

3. The device of claim 2, wherein the master display screen is configured to display the communication address information of the electric meters acquired by the master RS485 communication circuit and the preset high-frequency carrier signal frequency inputted through the master key.

4. The device of claim 1, wherein the master key is also configured to check the communication address information of the electric meter acquired by the master RS485 communication circuit and the preset high-frequency carrier signal frequency inputted through the master key.

5. The device of claim 2, wherein the master power supply is configured to supply power to the master detection device, wherein the master power supply is a lithium battery or the master power supply acquires electricity from inlet terminals of the electric meters through an electromagnetic coil.

6. The device of claim 1, wherein each of the master main control chip and the slave main control chip is a Field Programmable Gate Array (FPGA) chip, a Digital Signal Processing (DSP) chip, an ARM chip or a Single Chip Microcomputer.

7. A method for detecting electric meter misconnection, applied to a device for detecting electric meter misconnection of claim 1, comprising:

acquiring, by the master detection device, communication address information of the electric meters through the master RS485 communication circuit;

generating, by the master high-frequency signal generation circuit in the master detection device, high-frequency signals of different frequencies;

encoding, by the master signal modulation circuit in the master detection device, the communication address information of the electric meters to generate a self-defined protocol and encoded information; acquiring, by the master signal modulation circuit, the high-frequency signals of different frequencies generated by the master high-frequency signal generation circuit; modulating, by the master signal modulation circuit, the self-defined protocol into the high-frequency signals to obtain high-frequency carrier signals; and feeding, by the master signal modulation circuit, the high-frequency carrier signals into outlet terminals of the electric meters, wherein the high-frequency carrier signals comprise a first high-frequency carrier signal transmitted to a power grid and a second high-frequency carrier signal transmitted to a user air switch;

inputting, by the master key in the master detection device, a preset high-frequency carrier signal frequency;

transmitting, by the master signal modulation circuit in the master detection device, the second high-frequency carrier signal to the user air switch through a Power Line Communication (PLC) communication technology;

absorbing, by the master signal line trap in the master detection device, the first high-frequency carrier signal and a high-frequency interference signal transmitted from the power grid to the outlet terminals of the electric meters, wherein the master signal line trap is connected to the outlet terminals of the electric meters;

detecting, by a high-frequency carrier signal detection circuit in the slave detection device, the second high-frequency carrier signal; amplifying, by the high-frequency carrier signal detection circuit, the detected second high-frequency carrier signal to obtain a third high-frequency carrier signal; and transmitting, by the high-frequency carrier signal detection circuit, the third high-frequency carrier signal to the high-frequency carrier signal demodulation circuit;

demodulating, by the high-frequency carrier signal demodulation circuit in the slave detection device, the third high-frequency carrier signal to obtain a target high-frequency carrier signal frequency, and acquiring, by the high-frequency carrier signal demodulation circuit, the preset high-frequency carrier signal frequency and the encoded information transmitted by the master detection device;

performing, by the slave data processing module in the slave detection device, a protocol analysis on the encoded information and the second high-frequency carrier signal to obtain the communication address information corresponding to users;

storing the preset high-frequency carrier signal frequency, the target high-frequency carrier signal frequency, and the communication address information corresponding to users obtained by the slave data processing module in the slave $E^2PROM$ the slave detection device; and matching, by the slave main control chip in the slave detection device, the target high-frequency carrier signal frequency with the preset high-frequency carrier signal frequency to determine whether the electric meter misconnection occurs.

\* \* \* \* \*